(12) United States Patent
Kim

(10) Patent No.: US 12,506,040 B2
(45) Date of Patent: Dec. 23, 2025

(54) PACKAGING SUBSTRATE, SEMICONDUCTOR PACKAGE, PACKAGING SUBSTRATE PREPARATION METHOD, AND SEMICONDUCTOR PACKAGE PREPARATION METHOD

(71) Applicant: Absolics Inc., Covington, GA (US)

(72) Inventor: Sungjin Kim, Suwanee, GA (US)

(73) Assignee: Absolics Inc., Covington, GA (US)

( * ) Notice: Subject to any disclaimer, the term of this patent is extended or adjusted under 35 U.S.C. 154(b) by 398 days.

(21) Appl. No.: 18/013,365

(22) PCT Filed: Aug. 30, 2022

(86) PCT No.: PCT/US2022/041983
§ 371 (c)(1),
(2) Date: Dec. 28, 2022

(87) PCT Pub. No.: WO2023/034260
PCT Pub. Date: Mar. 9, 2023

(65) Prior Publication Data
US 2024/0096724 A1    Mar. 21, 2024

Related U.S. Application Data

(60) Provisional application No. 63/238,308, filed on Aug. 30, 2021.

(51) Int. Cl.
*H01L 23/31* (2006.01)
*H01L 23/13* (2006.01)
*H01L 23/15* (2006.01)

(52) U.S. Cl.
CPC ............ *H01L 23/315* (2013.01); *H01L 23/13* (2013.01); *H01L 23/15* (2013.01)

(58) Field of Classification Search
CPC ..... H01L 23/055; H01L 23/315; H01L 23/13; H01L 23/49827; H01L 23/49838
(Continued)

(56) References Cited

U.S. PATENT DOCUMENTS 5,727,104 A      3/1998 Sasaki et al.
2004/0089472 A1  5/2004 Ninomiya et al.
(Continued)

FOREIGN PATENT DOCUMENTS

EP    2178032 A1 *  4/2010 ....... G06K 19/07745
JP    2021-34568 A   3/2021
(Continued)

OTHER PUBLICATIONS

International Search Report issued on Nov. 30, 2022, in related International Patent Application No. PCT/US 22/41983 (2 pages).
(Continued)

*Primary Examiner* — Dale E Page
(74) *Attorney, Agent, or Firm* — NSIP Law

(57) ABSTRACT

A packaging substrate is provided. The packaging substrate includes a first area without a cavity and a second area with a cavity. The first area has first and second surfaces facing each other, and a cavity structure of the second area includes a cavity space; a contact surface; and a side wall. The contact surface is disposed opposite to the opening of the cavity structure. A value of a surface roughness of the contact surface is approximately three times or less of a value of a surface roughness of the first surface of the first area.

10 Claims, 6 Drawing Sheets

(58) Field of Classification Search
USPC .......................................................... 257/787
See application file for complete search history.

(56) References Cited

U.S. PATENT DOCUMENTS

| | | | |
|---|---|---|---|
| 2005/0051884 A1* | 3/2005 | Stevens | H01L 23/10 |
| | | | 257/E25.031 |
| 2009/0046183 A1 | 2/2009 | Nishida et al. | |
| 2010/0203283 A1* | 8/2010 | Zimmerman | H01L 23/492 |
| | | | 428/114 |
| 2013/0050227 A1 | 2/2013 | Petersen et al. | |
| 2017/0207160 A1 | 7/2017 | Gowda et al. | |
| 2019/0311981 A1 | 10/2019 | Gowda et al. | |
| 2020/0227394 A1* | 7/2020 | Yeh | H01L 21/565 |
| 2020/0235020 A1* | 7/2020 | Boek | H01L 24/19 |
| 2020/0258831 A1* | 8/2020 | Saiyajitara | H01L 23/49861 |
| 2021/0043528 A1 | 2/2021 | Kim et al. | |
| 2022/0051972 A1* | 2/2022 | Kim | H01L 23/49894 |

FOREIGN PATENT DOCUMENTS

| | | |
|---|---|---|
| KR | 10-1468680 B1 | 12/2014 |
| KR | 10-2016-0094502 A | 8/2016 |
| KR | 10-2016-0114710 A | 10/2016 |
| KR | 10-2019-0008103 A | 1/2019 |
| KR | 10-2092818 B1 | 3/2020 |
| TW | 201620158 A | 6/2016 |
| TW | 201838102 A | 10/2018 |
| TW | 201909245 A | 3/2019 |
| TW | 201927716 A | 7/2019 |
| TW | 202034469 A | 9/2020 |
| TW | 202114957 A | 4/2021 |
| WO | WO 2011/096362 A1 | 8/2011 |
| WO | WO 2018/210484 A1 | 11/2018 |
| WO | WO 2019/188843 A1 | 10/2019 |
| WO | WO 2020/185016 A1 | 9/2020 |

OTHER PUBLICATIONS

Written Opinion of the International Search Authority issued on Nov. 30, 2022, in related International Patent Application No. PCT/US 22/41983 (5 pages).

* cited by examiner

PACKAGING SUBSTRATE, SEMICONDUCTOR PACKAGE, PACKAGING SUBSTRATE PREPARATION METHOD, AND SEMICONDUCTOR PACKAGE PREPARATION METHOD

CROSS REFERENCE TO RELATED APPLICATIONS

This application is a U.S. National Stage Application of International Application No. PCT/US2022/041983, filed on Aug. 30, 2022, which claims the priority of U.S. Provisional Patent Application No. 63/238,308, filed Aug. 30, 2021, the entire disclosures of which are incorporated herein by reference for all purposes.

BACKGROUND

1. Field

The following description relates to packaging substrate, a semiconductor package, a packaging substrate preparation method, and a semiconductor package preparation method.

2. Description of Related Art

In the manufacturing of electronic components, an implementation of a circuit on a semiconductor wafer is referred to as a Front-End Process (FE), and an assembly of a wafer such that it can be actually used in a product is referred to as a Back-End Process (BE). The Back-End process includes a packaging process.

Four key technologies of the semiconductor industry that enable the rapid development of electronic products may include semiconductor technology, semiconductor packaging technology, manufacturing process technology and software technology. Semiconductor technology has been developed in various forms such as line width of a nanometer unit, which is smaller than a micrometer unit, 10 million or more cells, high-speed operation, and increased heat dissipation, but is not completely supported by packaging technology. Thus, it is considered that the electrical performance of packaged semiconductors may be determined by the packaging technology with electrical connection rather than a performance of a semiconductor itself.

Ceramic or resin may be used as the material of a substrate for packaging. In the example of a ceramic substrate such as Si substrate, it may not be easy to mount a high-performance and high-frequency semiconductor element thereon due to a high resistance or high dielectric constant. In the example of a resin substrate, it may be possible to mount a high-performance and high-frequency semiconductor element thereon. However, there is a limitation to the reduction of pitches of conductive lines.

Silicon or glass may be applied to a high-end packaging substrate. By forming a through via on a silicon or glass substrate and applying a conductive material into the through via, a length of conductive lines between an element and a motherboard may be shortened, and may have excellent electric characteristics.

Additionally, a semiconductor package may generate heat during operating, and a heat emitting device that emits this heat may be additively implemented.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In a general aspect, a packaging substrate includes a first area and a second area, wherein the first area is an area where a cavity structure is not disposed, the second area is an area where the cavity structure is disposed, the first area is configured to have a first surface and a second surface that are disposed to face each other, the cavity structure comprises a cavity space, a contact surface, and a side wall, the cavity space is a space in a depression of the cavity structure, and the cavity space comprises an opening disposed in one of an upper portion and a lower portion of the cavity structure, the contact surface is a surface disposed opposite to the opening of the cavity space, the side wall is a wall that surrounds the contact surface, and a value of a surface roughness of the contact surface is approximately three times or less of a value of a surface roughness of the first surface of the first area.

The first area and the second area may be arranged adjacent to each other.

The surface roughness of the contact surface may be equal to or less than 20 nm.

The side wall may be configured to connect the first surface of the first area with the contact surface, and the side wall may be configured to have an angle of 75 degrees to 100 degrees based on a line parallel to the second surface of the first area.

A substrate in the first area may include a glass substrate, a substrate in the second area comprises a glass substrate, and the glass substrate in the first area and the glass substrate in the second area are connected to each other.

The second area may have a first surface and a second surface that are disposed to face each other, and a first distance between the first surface of the second area and the second surface of the second area is 0.3 to 0.7 times a second distance between the first surface of the first area and the second surface of the first area.

The first distance may be equal to or greater than 100 μm.

The second area may include a frame, and the frame may be configured to distinguish the cavity space into two or more areas.

The second area may further include a cavity via that penetrates the packaging substrate.

A semiconductor package may include a packaging substrate; an upper redistribution layer disposed on the first surface of the first area; and a connection device disposed under the second surface of the first area.

A passive element may be disposed in the cavity space.

Other features and aspects will be apparent from the following detailed description, the drawings, and the claims.

BRIEF DESCRIPTION OF DRAWINGS

Throughout the drawings and the detailed description, the same reference numerals may refer to the same, or like, elements. The drawings may not be to scale, and the relative size, proportions, and depiction of elements in the drawings may be exaggerated for clarity, illustration, and convenience.

DETAILED DESCRIPTION

Figure 1:
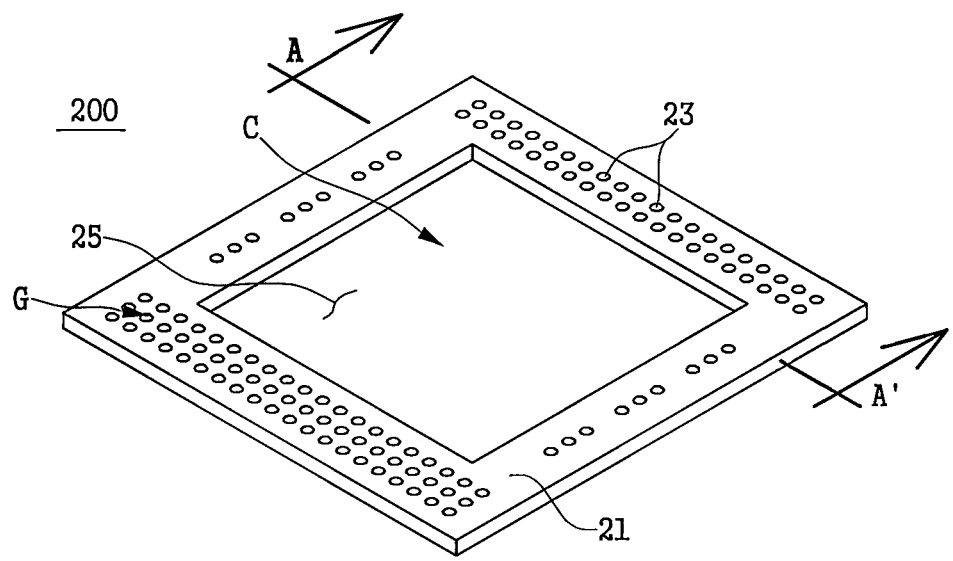
FIG. 1 is a perspective drawing illustrating an example packaging substrate, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

In the one or more examples, the term "X-based" may mean that a compound includes a compound corresponding to X or a derivative of X.

In the one or more examples, "B being placed on A" means that B is placed in direct contact with A or placed over A with another layer interposed therebetween and thus should not be interpreted as being limited to B being placed in direct contact with A.

In the one or more examples, "B being connected to A" means that B is connected to A directly or through another element therebetween, and thus should not be interpreted as being limited to B being directly connected to A, unless otherwise noted.

In the one or more examples, a singular form is contextually interpreted as including a plural form as well as a singular form unless specially stated otherwise.

In the one or more examples, the length, thickness, angle, ratio, and the like of drawing may be expressed with exaggeration, and the one or more examples should not be interpreted as being limited in the right due to the exaggeration.

The one or more examples are integrated by a simplified preparation process, and are applicable to a package with high-frequency and high-performance.

One or more examples provide a packaging substrate, a semiconductor package, a packaging substrate preparation method, and a preparation method of a semiconductor package, which are excellently integrated by a simplified manufacturing process and applicable to a package with high-frequency and high-performance.

A packaging substrate and a semiconductor package of example embodiments may be excellently integrated, and may be applicable to a high-frequency and high-performance package.

A packaging substrate preparing method and a semiconductor package preparing method may manufacture a via formed in a complicated structure or a cavity formed with a large area within considerably shortened time by implementing relatively simplified manufacturing process.

Hereinafter, example embodiments will be described in further detail.

Substrate for Packaging

Figure 2:
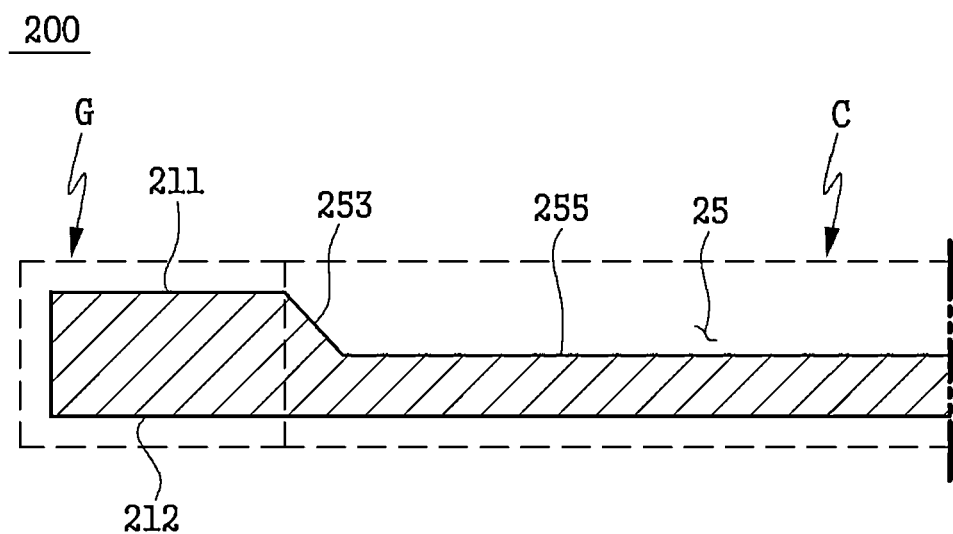
FIG. 2 is a conceptual view illustrating the A-A' section of FIG. 1.
Figure 3:
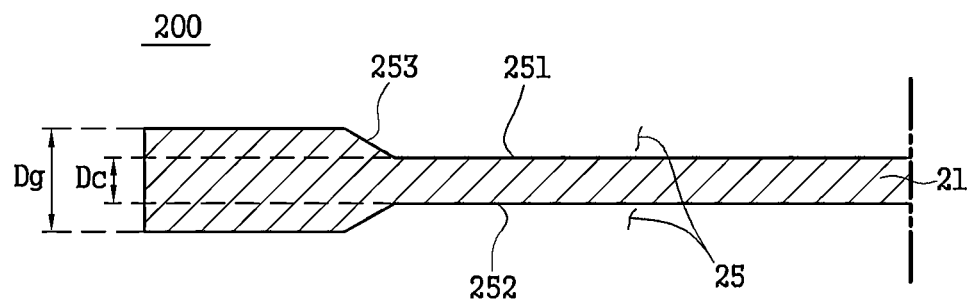
FIG. 3 is another conceptual view illustrating the A-A' section of FIG. 1.

FIG. 1 illustrates a perspective drawing an example packaging substrate, FIG. 2 illustrates a conceptual view illustrating the A-A' section of FIG. 1, and FIG. 3 illustrates a conceptual view of the A-A' section of FIG. 1. Hereinafter, with reference to FIG. 1 to FIG. 3, a packaging substrate is described in detail.

A packaging substrate 200, in accordance with one or more embodiments, comprises are G and are C, which may be distinct from each other. Area C area is an area where a cavity structure is disposed, and area G is an area where a cavity structure is not disposed. Area G and area C may be arranged to neighbor to each other. A packaging substrate 200 may comprise one area C, or two or more C areas.

Area G may have a 1-1 surface 211 and a 1-2 surface 212, wherein the 1-1 surface 211 and the 1-2 surface face each other. Area G may have the 1-1 surface 211 and the 1-2 surface 212 arranged side by side to be flat, and for example, the 1-1 surface 211 and 1-2 surface 212 may be substantially parallel. In a non-limited example, area G may comprise a glass substrate.

Area G may comprise one or more through vias 23. The through vias 23 penetrating the 1-2 surface 212 from the 1-1 surface 211 may be vias whose opening (not shown) substantially have a circular shape. However, the through via is not limited to examples whose opening has a circular shape, and may be, as only examples, a circular shape, an oval shape, a quadrangle shape, or the like.

In an example, area C may comprise a cavity structure.

The cavity structure refers to a structure comprising a concave part at a portion of a packaging substrate 200 that disposes an element substantially inside the packaging substrate 200. A space formed by the concave part is referred to as a cavity space.

The cavity structure comprises a cavity space 25; a contact surface 255; and a side wall 253.

The cavity space 25 is a space formed by denting, and has an opening in an upper portion or a lower portion.

The contact surface 255 may be contacted with an element directly or through intermediation of another layer. The contact surface 255 may be disposed to be opposite to the opening.

The side wall 253 is a wall surrounding the contact surface 255. When the contact surface 255 has a quadrangle shape, the side wall 253 may comprise four planes. When the contact surface 255 has a circular shape, the side wall may substantially have a cylinder shape, a truncated cone shape, or an hourglass shape, as only examples.

The side wall 253 connects the 1-1 surface 211 with the contact surface 255.

Figure 4:
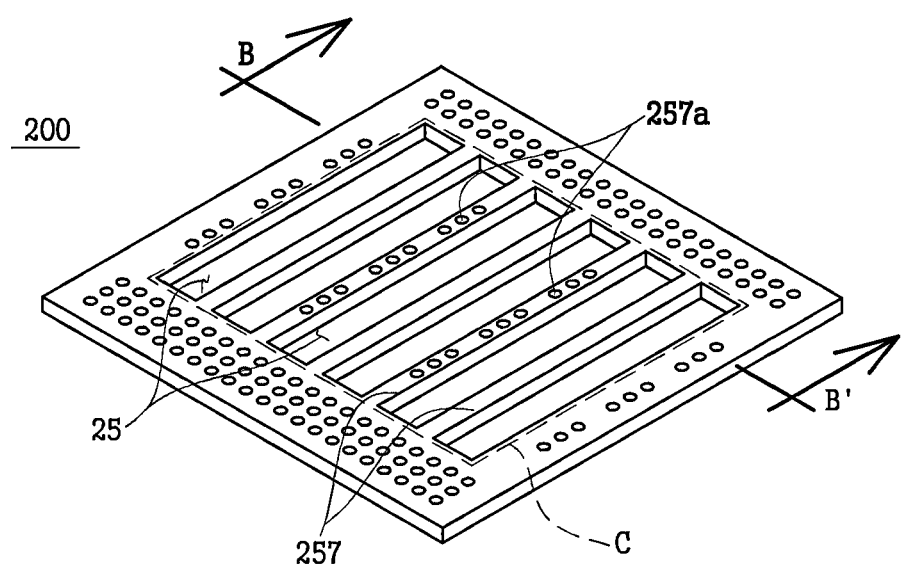
FIG. 4 is a perspective drawing illustrating an example packaging substrate, in accordance with one or more embodiments.

In a non-limited example, one, two, or more cavity structures may be disposed inside area C. When two or more cavity structures are disposed inside area C, the cavity space may be distinguished by at least one a frame 257 (FIG. 4).

That is, area C may further have a frame 257 disposed therein, and the frame 257 may distinguish the cavity space 25 into two or more cavities.

The side wall 253 may connect a contact surface 255 and a frame 257 neighboring to each other.

Referring to FIG. 3, area C has 2-1 surface 251 and 2-2 surface 252 facing each other. In area C comprising plural cavity structures, each cavity structure comprises each contact surface 255, and this contact surface 255 becomes 2-1 surface 251 or 2-2 surface 252.

The frame 257 may comprise glass. In an example, a glass in a bar shape may be applied as the frame.

An upper surface of the frame may be disposed to be substantially the same as the 1-1 surface. An upper surface of the frame may be disposed to be substantially the same as the 1-2 surface. In such an example, it may be easier to form a redistribution layer on an upper surface of a frame.

The cavity space may be disposed in an upper portion based on the center of a packaging substrate (refer to FIG. 2). The cavity space may be disposed in a lower portion based on the center of a packaging substrate (not shown). The cavity space may be disposed in both of an upper portion and a lower portion based on the center of a packaging substrate (refer to FIG. 3).

Based on the designation of an upper surface as the 2-1 surface 251 and a lower surface as the 2-2 surface 252 within a packaging substrate, the contact surface is the 2-1 surface 251 when a cavity space is disposed in an upper portion, and the contact surface is the 2-2 surface 252 when the cavity space is disposed in a lower portion.

The 2-1 surface 251 and the 2-2 surface 252 may face each other. The 2-1 surface 251 and the 2-2 surface 252 may be disposed side by side to be flat, and for example, may substantially be parallel with each other. Area C may comprise a glass substrate.

In area G and area C, a packaging substrate may be made of a glass substrate 21 which may be substantially a same material. Area G and area C may be formed to be one body, as a non-limiting example.

Any glass applied to a packaging substrate is applicable as the glass, borosilicate glass and non-alkali glass may be applied, but it is not limited thereto.

A packaging substrate 200 may be applied by processing a glass substrate to be the same shape as the above. A packaging substrate having a through via, a cavity structure, and the like can be obtained by performing an etching treatment after processing of a pane of glass such as masking or forming a defect. The detailed processing method is described below.

CRa is surface roughness Ra (Arithmetic mean roughness value) in a contact surface 255, and GRa is surface roughness Ra in 1-1 surface 211. A packaging substrate has a characteristic of CRa which is about three times or less of GRa.

The 1-1 surface 211 and a contact surface 255 may be in contact with an element directly or through intermediation of another layer. An element may be desired to receive signals or transmit signals by being connected with an electrically conductive layer which is referred to as a redistribution line. Not only in an example of elements directly in contact with a surface, but also in an example of elements contacted through another layer, surface roughness may affect the properties of a surface which is directly in contact with elements. As a result of miniaturing a width and an interval of a redistribution line, the surface roughness described above may affect the formation of a redistribution line. Thus, the surface roughness of the surfaces where a redistribution line is disposed may have to be controlled.

In one or more examples, CRa may be about 2.5 times or less, or about two times or less of GRa. CRa may be about 1.8 times or less, or about 1.7 times or less of GRa. CRa may be about 0.1 times or more, or about 0.3 times or more of GRa. When surface roughness is controlled to be in such a range, it is more advantageous in the formation of a redistribution line as a fine line, and may enable the manufacture of a thinner semiconductor package.

CRa may be a smaller value than GRa. In one or more examples, an element disposed in a cavity space may be an element having a thinner thickness, or having a thinner thickness and a smaller size compared to an element which is ordinarily mounted on a packaging substrate. Accordingly, surface roughness of a contact surface 255 is preferable to be controlled in a considerably small level, and for example, CRa may be about 20 nm or less, about 10 nm or less, or about 5 nm or less. CRa may be about 0.1 nm or more.

CRq is surface roughness Rq (Root mean squared roughness) in a contact surface 255, and GRq is surface roughness Rq in 1-1 surface 211. A substrate for packaging 200 has a characteristic of CRa which is two times or less of GRq.

In one or more examples, CRq may be about 1.8 times or less, or about 1.7 times or less of GRq. CRq may be about 0.1 times or more, or about 0.3 times or more of GRq. When surface roughness is controlled to be in such a range, it is more advantageous in the formation of a redistribution line as a fine line, and may enable the manufacture of a thinner semiconductor package.

In an example of a packaging substrate which applies a prepreg as an interposer, due to characteristics of a glass fiber and a polymer themselves, it may be substantially difficult to lower surface roughness. Additionally, an example of allowing the prepreg itself to be concave to form a cavity structure is also uncommon. Though a cavity structure may be formed by applying a punching operation or the like, however, this may form a cavity structure in a shape of passing through up to down substantially, rather than forming a cavity structure as an example embodiment.

In an example of a glass substrate, a characteristic of etching which is faster in a portion where a defect is formed than a portion where a defect is not formed may be utilized to form a spatial structure such as a via. For example, laser or the like is irradiated to form a defect in a glass partially, and etching thereof is performed to form a via in a defect portion.

Even when a cavity is formed on a glass substrate, plural defects may be formed on glass by irradiating laser closely with having a regular interval at the portions to be a concave part of a cavity, and are etched. The defects may be connected to each other during an etching process, thereby manufacturing a caving part of a cavity.

Figure 11:
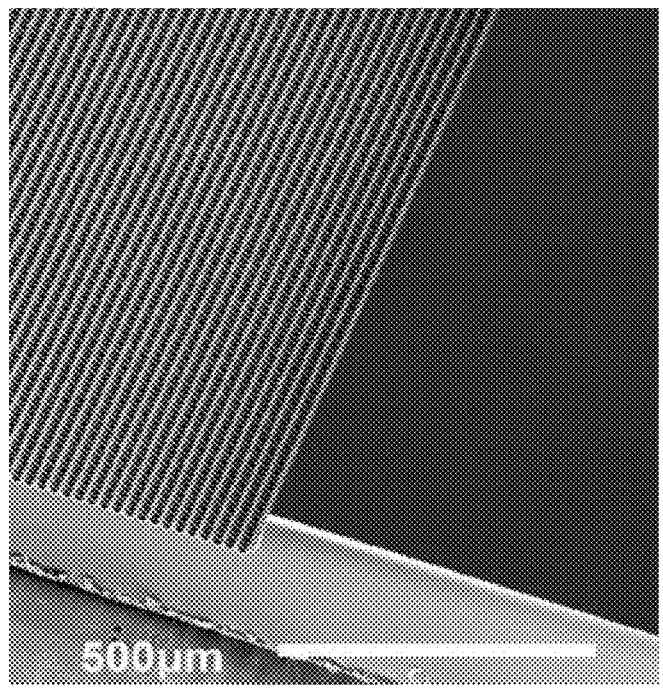
FIG. 11 illustrates a picture of observing the surface treated by etching after laser irradiation to a glass substrate, in accordance with one or more embodiments.

Irradiation of laser is ordinarily performed in a shape of a point or a line, thus a defect may be formed in a shape of a point or a line rather than in a shape of a plane, and due to a difference in etching degree between a portion where a defect is formed and its circumference, an etching surface (a bottom surface or an upper surface) may have a considerably uneven surface. Commonly, the etching surface has Ra surface roughness of about 10 μm or more (referring to FIG. 11, surface roughness Ra at a bottom surface of a cavity is about 16 μm).

Embodiments may perform masking of the surface within G area and C area excepting for positions where a cavity space 25 is formed, forming a concave part of a cavity through etching (primary etching) or the like, and then laser irradiating for the formation of a via or the like. And after that, a method of additive etching (secondary etching) or the like may be applied. The detailed method is described below.

Figure 8:
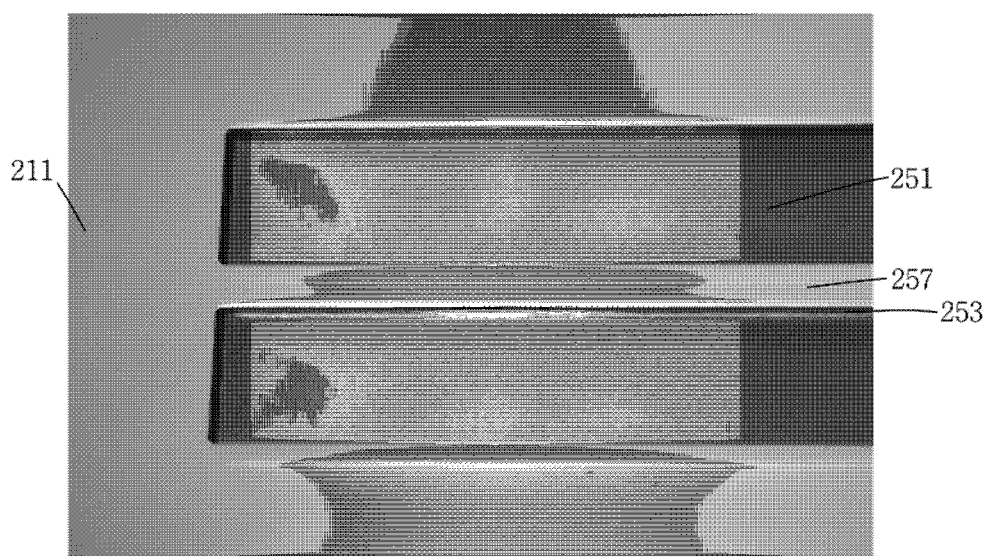
FIG. 8 illustrates an image of a packaging substrate manufactured according to one embodiment as viewed in an oblique direction.
Figure 9:
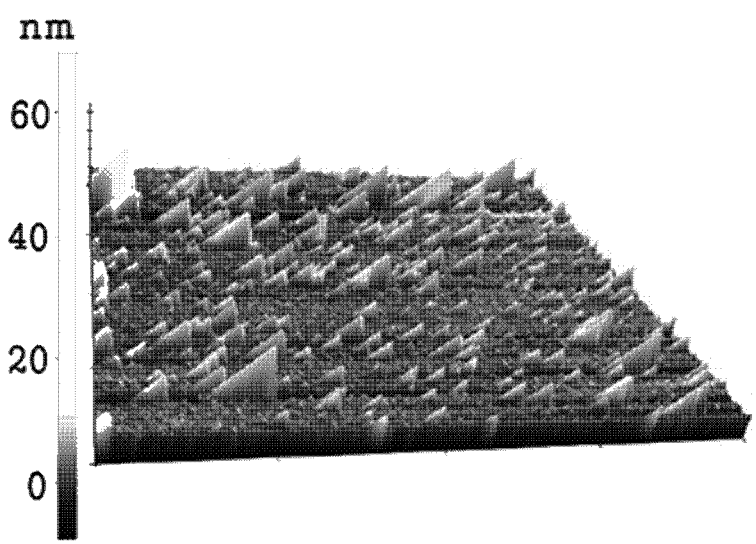
FIG. 9 illustrates a result of AFM analysis for the surface of a glass substrate, which is manufactured into a packaging substrate, in accordance with one or more embodiments, before primary etching thereof.
Figure 10:
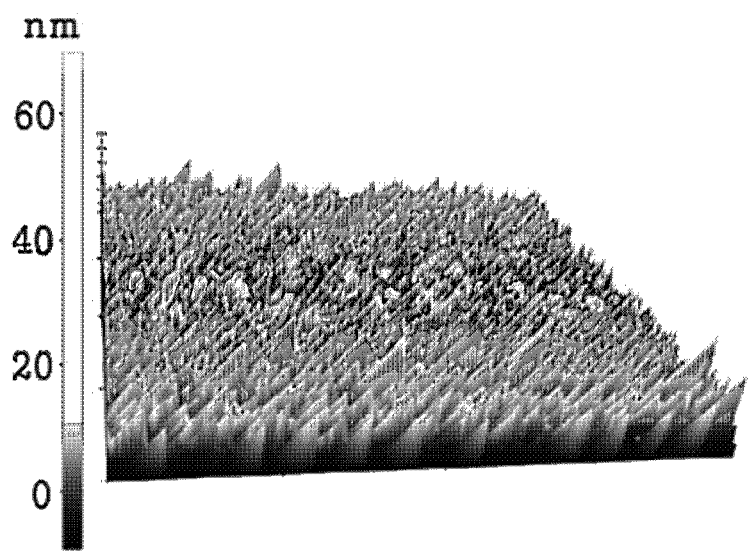
FIG. 10 illustrates a result of AFM analysis for the surface of a glass substrate of FIG. 9 after primary etching thereof, in accordance with one or more embodiments.

When a cavity space is formed without forming defects in a point shape of a line shape, an etching surface (a bottom surface or an upper surface of a cavity) is comparatively easily controlled in the surface shape, and it is possible to provide an etching surface in which roughness does not have a large difference from the roughness of the surface of area G (referring to FIG. 8 to FIG. 10, surface roughness before processing of FIG. 9 has Rq of 1.041 nm and Ra of 0.796 nm, and surface roughness before processing of FIG. 10 has Rq of 1.730 nm and Ra of 1.306 nm).

The controlled surface roughness in a bottom surface or an upper surface of a cavity may be a base to form an elaborate electrically conductive layer in a cavity space, and it may help the element to be well arranged in the cavity space.

When the bottom surface or the upper surface of a cavity has great surface roughness, a method of flattening the surface through an insulating layer may be considered, but this may thicken a packaging substrate unnecessarily, may complicate a process, and may make it difficult substantially to form a through via (cavity via 255a) on a bottom surface or an upper surface of a cavity.

A side wall 253 may connect the 1-1 surface 211 and a contact surface 255, and may have an angle, as only an example, of about 75 degrees to about 100 degrees based on a line parallel to the 1-2 surface 212. In an example, the angle may be about 80 degrees to about 95 degrees, or about 85 degrees to about 92 degrees. A side wall having such an angle may lower a possibility of forming a void between an element disposed in a cavity space and a side wall during the manufacture of a semiconductor packaging.

Dg is a thickness of a packaging substrate in an area where a cavity structure is not formed, and Dc is a thickness of a packaging substrate at a cavity space. That is, Dg is a distance between the 1-1 surface 211 and the 1-2 surface 212, and Dc is a distance between the 2-1 surface 251 and the 2-2 surface 252.

In an example, the length Dc may be 0.3 to 0.7 times the length Dg.

In an example, the length Dc may be 0.3 to 0.55 times the length Dg.

When having such a thickness ratio, a packaging substrate having durability in addition to sufficient performance to support a packaging substrate can be provided.

In examples, the length Dc may be about 100 μm, about 150 μm, about 200 μm, or about 300 μm. Such a Dc value may allow a cavity area having a comparatively thin thickness to have supporting performance for elements, durability, and the like.

The length Dg may be about 300 μm or more, about 400 μm or more, or about 500 μm or more. The length Dg may be about 3000 μm or less, about 2500 μm or less, about 2000 μm or less, or about 1000 μm or less.

A packaging substrate may be a glass substrate. Area G and are C may respectively be glass substrates, and they may be connected to each other to form one body. A frame may be a glass material, and a glass substrate of area C and the frame in the glass material may be connected to each other to form one body.

A skeleton of a packaging substrate may be a glass substrate. The skeleton of a packaging substrate refers to a substrate that is prepared before formation of an electrically conductive layer or an insulating layer.

A packaging skeleton may have area G and area C that are derived from one glass substrate. A packaging skeleton may have a cavity structure and a frame that are derived from one glass substrate.

Figure 5:
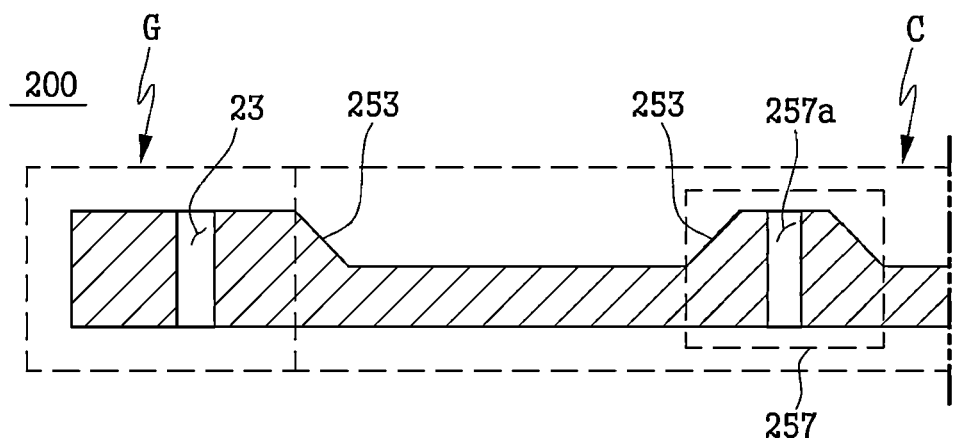
FIG. 5 is a conceptual view illustrating the B-B' section of FIG. 4.
Figure 6:
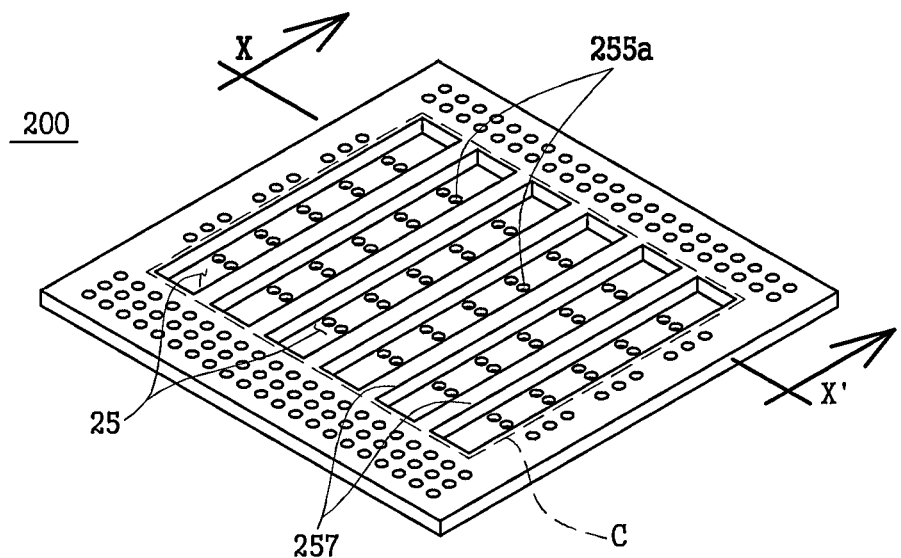
FIG. 6 is a perspective drawing illustrating an example packaging substrate, in accordance with one or more embodiments.
Figure 7:
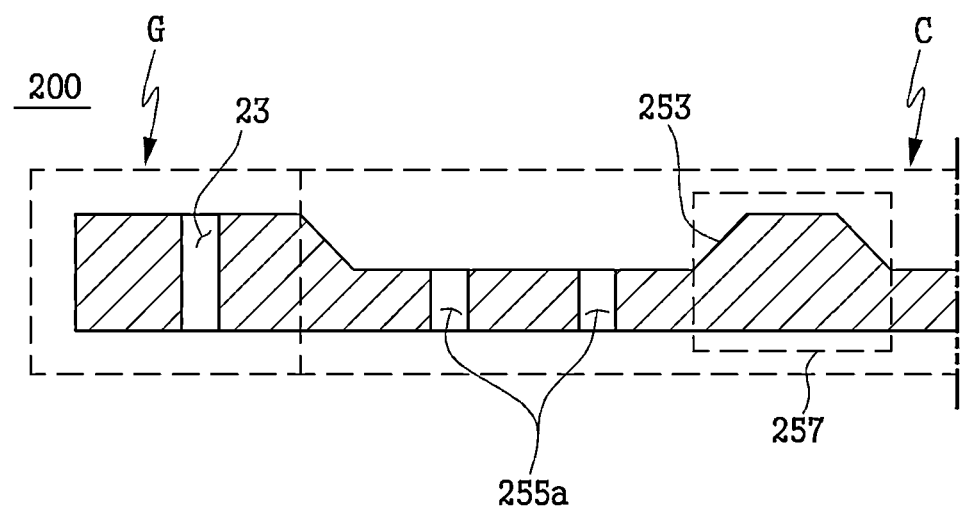
FIG. 7 is a conceptual view illustrating the X-X' section of FIG. 6.

FIG. 4 illustrates a perspective drawing of another example packaging substrate, and FIG. 5 illustrates a conceptual view of the B-B' section of FIG. 4. FIG. 6 illustrates a perspective drawing of an example packaging substrate, and FIG. 7 illustrates a conceptual view of the X-X' section of FIG. 6. With reference to FIG. 4 to FIG. 7, a packaging substrate, in accordance with one or more embodiments, is described in detail.

A packaging substrate, in accordance with one or more embodiments, is a packaging substrate comprising area G and area C, and all descriptions in the above such as respective areas, a cavity structure, a contact surface, roughness, and the like are also applied to this embodiment.

In an example, area C may comprise a through via.

For example, a through via penetrating a contact surface may be disposed in area C. Such a through via is referred to as a cavity via 255a for the purpose of distinguishing from a through via in area G. The cavity via 255a penetrates a cavity substrate from the 2-1 surface 251 to the 2-2-surface 252.

An electrically conductive layer may be disposed inside a cavity via 255a. The electrically conductive layer may connect an element disposed in a cavity space 25 to another element disposed on a packaging substrate or a motherboard (not shown) disposed under the packaging substrate.

A cavity via allows a cavity space and one surface of a packaging substrate to be connected in a short distance while penetrating the packaging substrate. A connection may refer to a connection device that enables the transmission of electrical signals through an electrically conductive layer such as copper. In an example, the connection device may be a connection by a redistribution line.

For example, a through via penetrating a frame may be disposed in area C. Such a through via is referred to as a frame via 257a for the purpose of distinguishing from a through via in area G.

Referring to FIG. 4, a frame via 257a may penetrate one surface of a frame.

When area C comprises a cavity space disposed in a lower portion of a substrate, a frame via 257a may penetrate a cavity substrate from one surface of a frame to 2-1 surface 251.

When area C comprises a cavity space disposed in an upper portion of a substrate, a frame via 257a may penetrate a cavity substrate from one surface of a frame to 2-2 surface 252.

When area C comprises cavity spaces in upper and lower portions, a frame via 257a may penetrate a packaging substrate from a surface of a frame disposed in an upper portion to a surface of a frame disposed in a lower portion.

A frame via 257a allows area C to connect an upper surface and a lower surface in a short distance while penetrating the packaging substrate. A connection may refer to a connection device that enables the transmission of electrical signals through an electrically conductive layer such as copper. In an example, the connection device may be a connection by a redistribution line.

A semiconductor package may be composed to be a form of placing an element (cavity element) inside a cavity space and loading a semiconductor element in one surface of a packaging substrate. Accordingly, a frame via allows connection between a first surface and a second surface of a packaging substrate in a short distance.

A semiconductor package may place a computing element (or a memory element) on a first surface, may place a motherboard or the like under a second surface, and may place an electric power transmission element at a cavity space. A cavity via 255a allows connection between a computing element (or a memory element) and a motherboard in a short distance. A cavity via 255a allows connection between an electric power transmission element and a computing element (or a memory element), and connection between an electric power transmission element and a motherboard in a short distance.

Such a connection in a short distance allows quick transmission of signals, and particularly it is advantageous when packaging a high-frequency and high-performance element.

A cavity via 255a and a frame via 257a may have an opening (not shown) which is substantially a circular shape. However, the opening is not limited to a circular shape, and various shapes such as, but not limited to, a circular shape, an oval shape, and a quadrangle shape may be applicable, as the same as the above description of a through via.

Additionally, descriptions of a material or a skeleton of a packaging substrate are also the same as discussed above. The skeleton of a packaging substrate may have a through via and a cavity via that are derived from one glass substrate. The skeleton of a packaging substrate may have a through via and a frame via that are derived from one glass substrate. The skeleton of a packaging substrate may have a through via, a cavity via, and a frame via that are derived from one glass substrate.

Semiconductor Package

A semiconductor package, in accordance with one or more embodiments, comprises a packaging substrate described above, an upper redistribution layer disposed on the 1-1 surface 211; and a connection device disposed under the 1-2 surface 212.

A semiconductor package stably supports a computing element or a memory element loaded on the upper redistribution layer through a packaging substrate, helps the upper redistribution layer to have an electrically conductive layer as a fine line, and is useful for packaging of a high-frequency and high performance semiconductor element.

A passive element may be disposed in the cavity space, and for example, an electric power transmission element such as a capacitor may be disposed.

Manufacturing Method for Substrate for Packaging

A manufacturing method for a packaging substrate, in accordance with one or more embodiments, comprises an operation of preparing a target substrate comprising a masking area where masking treatment with an etch-resistant characteristic is applied and a non-masking area where the masking treatment is not applied; an operation of preparing a primary etching substrate by primary etching of the target substrate; an operation of preparing a pre-treated substrate by forming a defect at a predetermined position of the primary etching substrate; and an operation of preparing a packaging substrate by secondary etching of the pre-treated substrate.

The packaging substrate is a packaging substrate described above.

The masking area of the target substrate comprises an area corresponding to area G of the packaging substrate.

The masking area of the target substrate comprises an area corresponding to a frame in area C of the packaging substrate.

The non-masking area of the target substrate comprises an area corresponding to a cavity space in area C of the packaging substrate.

A packaging substrate may further comprise a through via. A through via is disposed in the G area and has the same characteristics as the above description, such as a via penetrating a substrate and the like.

Substantially, a through via may be formed through the secondary etching.

A packaging substrate may further comprise a cavity via. The cavity via is disposed in the area C and has the same characteristics as the above description, such as a via penetrating a substrate and the like.

A cavity via may substantially be formed through the secondary etching.

A packaging substrate may further comprise a frame via. The frame via may be disposed in the frame and has the same characteristic as the above description, such as a via penetrating a substrate and the like.

A frame via may be formed through the secondary etching, substantially.

A through via and a cavity space may be formed at the same time, substantially.

A cavity space and a frame via may be formed at the same time, substantially.

The above may heighten efficiency of a process while easily controlling surface roughness of a bottom surface or an upper surface of a cavity space, and form a via or a through via at many positions of a packaging substrate with efficient and high accuracy.

Manufacturing Method for Semiconductor Package

A semiconductor package manufacturing method, in accordance with one or more embodiments, comprises an operation of preparing a packaging substrate; an operation of preparing a core substrate by forming an electrically conductive layer and an insulating layer in predetermined positions of the via and the surface of the packaging substrate, and arranging elements in the cavity space; an operation of preparing a substrate comprising a redistribution line by forming an upper distribution layer on one surface of the core substrate; and an operation of mounting semiconductor elements in a substrate comprising the redistribution line.

The packaging substrate may have a characteristic described above.

The packaging substrate may be one manufactured by a method described above.

An element disposed in the cavity space may be a passive element.

The redistribution line comprises a fine line in at least some.

The fine line may be an electrically conductive layer whose width is 5 µm or less, or 4 µm or less. The fine line may be an electrically conductive layer whose width is more than 1 µm.

An electrically conductive layer may have a smooth surface. In an example, the electrically conductive layer may have surface roughness Ry of about 200 nm or less, more than about 0 nm and 180 nm or less, about 2 nm to about 150 nm, or about 5 nm to about 100 nm.

The semiconductor package enables embodying an implementation as a fine line by utilizing a packaging substrate and embodying of a high-performance semiconductor package in a small size. Additionally, by applying a glass substrate as a packaging substrate, it may have advantages in a process and performance (ex: embodying of a fine line, inhibiting the occurrence of a parasite element at a high frequency, and the like), that are distinct from a typical silicon, and can simplify a process for the formation of a cavity space.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A packaging substrate, comprising:
a first area and a second area,
wherein:
the first area is an area where a cavity structure is not disposed,
the second area is an area where the cavity structure is disposed,
the first area is configured to have a first surface and a second surface that are disposed to face each other,
the cavity structure comprises a cavity space, a contact surface, and a side wall,
the cavity space is a space in a depression of the cavity structure, and the cavity space comprises an opening disposed in one of an upper portion and a lower portion of the cavity structure,
the contact surface is a surface disposed opposite to the opening of the cavity space,
the side wall is a wall that surrounds the contact surface, and
a value of a surface roughness of the contact surface is approximately three times a value of a surface roughness of the first surface of the first area, and
wherein:
the side wall is configured to connect the first surface of the first area with the contact surface; and
the side wall is configured to have an angle of 75 degrees to 100 degrees based on a line parallel to the second surface of the first area.

2. The packaging substrate of claim 1, wherein the first area and the second area are arranged adjacent to each other.

3. The packaging substrate of claim 1, wherein the surface roughness of the contact surface is equal to or less than 20 nm.

4. The packaging substrate of claim 1, wherein:
a substrate in the first area comprises a glass substrate,
a substrate in the second area comprises a glass substrate, and
the glass substrate in the first area and the glass substrate in the second area are connected to each other.

5. The packaging substrate of claim 1, wherein:
the second area has a first surface and a second surface that are disposed to face each other, and
a first distance between the first surface of the second area and the second surface of the second area is 0.3 to 0.7 times a second distance between the first surface of the first area and the second surface of the first area.

6. The packaging substrate of claim 5, wherein the first distance is equal to or greater than 100 μm.

7. The packaging substrate of claim 1, wherein:
the second area includes a frame, and
the frame is configured to distinguish the cavity space into two or more areas.

8. The packaging substrate of claim 1, wherein the second area further comprises a cavity via that penetrates the packaging substrate.

9. A semiconductor package, comprising:
a packaging substrate according to claim 1; an upper redistribution layer disposed on the first surface of the first area; and a connection device disposed under the second surface of the first area.

10. The semiconductor package of claim 9, wherein a passive element is disposed in the cavity space.

* * * * *